United States Patent
Kim et al.

(10) Patent No.: US 11,017,721 B2
(45) Date of Patent: May 25, 2021

(54) ORGANIC LIGHT EMITTING DISPLAY DEVICE

(71) Applicant: LG Display Co., Ltd., Seoul (KR)

(72) Inventors: So Hyun Kim, Goyang-si (KR); Yu Sok Lim, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/633,110

(22) PCT Filed: Jul. 31, 2018

(86) PCT No.: PCT/KR2018/008683
§ 371 (c)(1),
(2) Date: Jan. 22, 2020

(87) PCT Pub. No.: WO2019/027225
PCT Pub. Date: Feb. 7, 2019

(65) Prior Publication Data
US 2020/0234646 A1     Jul. 23, 2020

(30) Foreign Application Priority Data
Jul. 31, 2017 (KR) .................. 10-2017-0096766

(51) Int. Cl.
*G09G 3/3258* (2016.01)
*G09G 3/325* (2016.01)
(Continued)

(52) U.S. Cl.
CPC ......... *G09G 3/3258* (2013.01); *G09G 3/325* (2013.01); *G09G 3/3275* (2013.01);
(Continued)

(58) Field of Classification Search
CPC ... G09G 2300/0866; G09G 2310/0262; G09G 3/3233; G09G 3/325; G09G 3/3258;
(Continued)

(56) References Cited

U.S. PATENT DOCUMENTS 8,558,825 B2* 10/2013 Bae .................. G09G 3/3233
                                                345/211
9,953,583 B2* 4/2018 Yoon ................. G09G 3/3233
(Continued)

FOREIGN PATENT DOCUMENTS

KR      10-1581593 B1    12/2015
KR   10-2017-0077921 A     7/2017

OTHER PUBLICATIONS

PCT International Search Report and Written Opinion, PCT Application No. PCT/KR2018/008683, dated Dec. 3, 2018, 13 pages.

*Primary Examiner* — Dmitriy Bolotin
(74) *Attorney, Agent, or Firm* — Fenwick & West LLP

(57) ABSTRACT

The present disclosure relates to an organic light emitting display device including a display panel on which a plurality of data lines, a plurality of gate lines, a plurality of first power lines, a plurality of second power lines, and a plurality of pixels are disposed. Each of the plurality of pixels includes: a storage capacitor connected between a first node and a second node; a driving transistor including a gate electrode connected to the second node, a drain electrode connected to the power line, and a source electrode connected to the first node; an organic light emitting diode connected to the first node and the second power line; a first switching transistor connected to the second node and the data lines; and a second switching transistor connected to the first node and the first power lines.

15 Claims, 7 Drawing Sheets

(51) Int. Cl.
*G09G 3/3275* (2016.01)
*H01L 27/32* (2006.01)

(52) U.S. Cl.
CPC ...... *H01L 27/3262* (2013.01); *H01L 27/3265* (2013.01); *H01L 27/3276* (2013.01); *G09G 2300/0866* (2013.01); *G09G 2310/0262* (2013.01)

(58) Field of Classification Search
CPC .............. G09G 3/3275; H01L 27/3262; H01L 27/3265; H01L 27/3276
See application file for complete search history.

(56) References Cited

U.S. PATENT DOCUMENTS

| | | | |
|---|---|---|---|
| 2006/0208971 A1 | 9/2006 | Deane | |
| 2008/0024400 A1* | 1/2008 | Uchino | G09G 3/3266 345/77 |
| 2008/0111809 A1* | 5/2008 | Lo | G09G 3/2014 345/212 |
| 2009/0109147 A1 | 4/2009 | Park et al. | |
| 2013/0141412 A1* | 6/2013 | Kang | G09G 3/3233 345/212 |
| 2013/0222356 A1* | 8/2013 | Jeong | G09G 3/3233 345/211 |
| 2014/0361960 A1 | 12/2014 | Yamauchi | |
| 2015/0179105 A1* | 6/2015 | Mizukoshi | G09G 3/3266 345/76 |
| 2015/0187278 A1 | 7/2015 | Park | |
| 2016/0005384 A1* | 1/2016 | Yoon | G09G 3/3233 345/213 |
| 2017/0287390 A1* | 10/2017 | Lee | G09G 3/3233 |
| 2019/0005886 A1* | 1/2019 | Lee | G09G 3/3258 |
| 2019/0251904 A1* | 8/2019 | Kim | G09G 3/3233 |

\* cited by examiner

[Fig. 1]
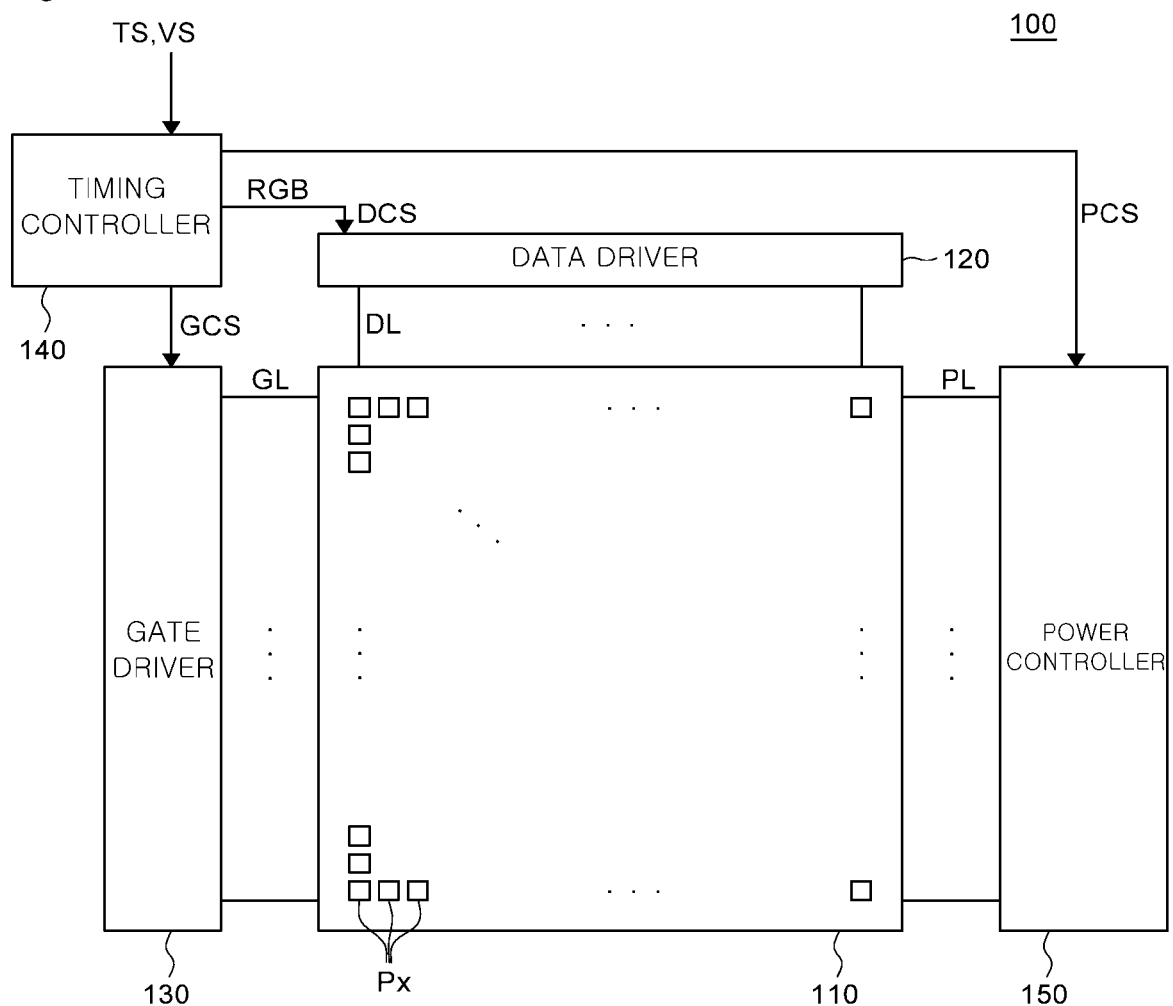

[Fig. 2]
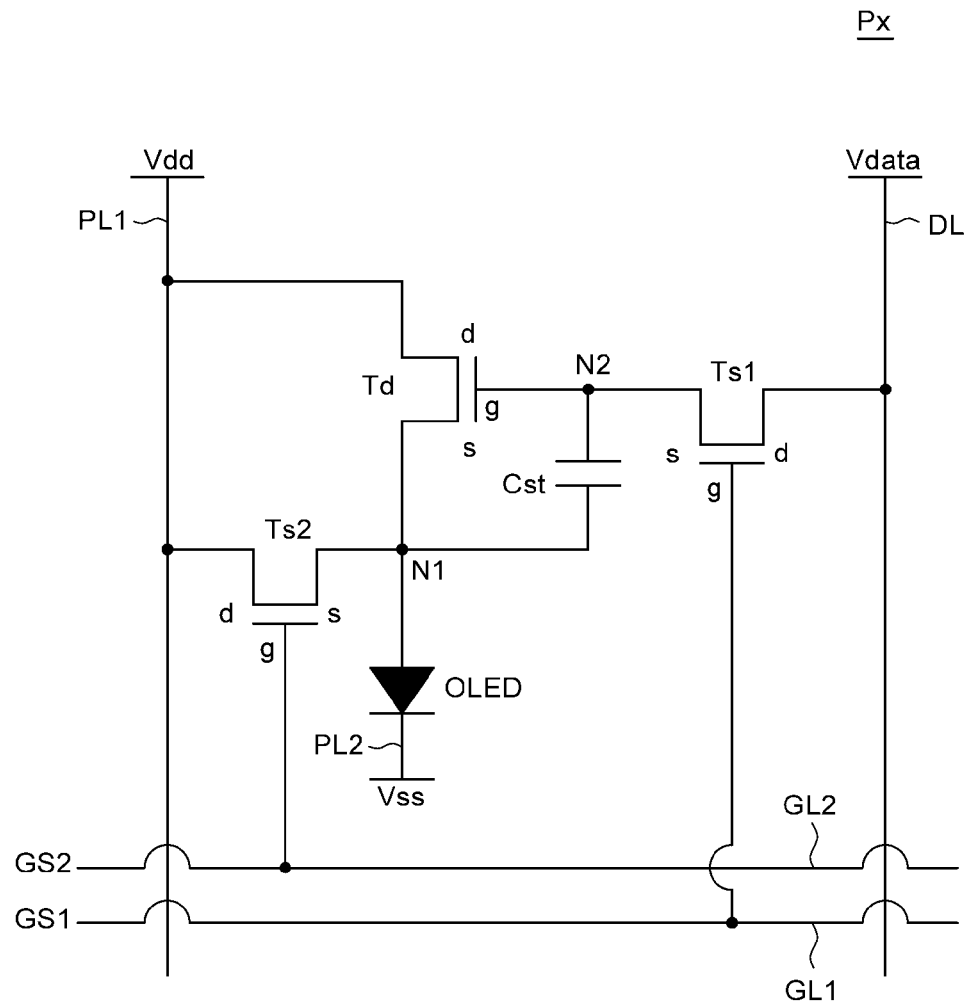

[Fig. 3A]
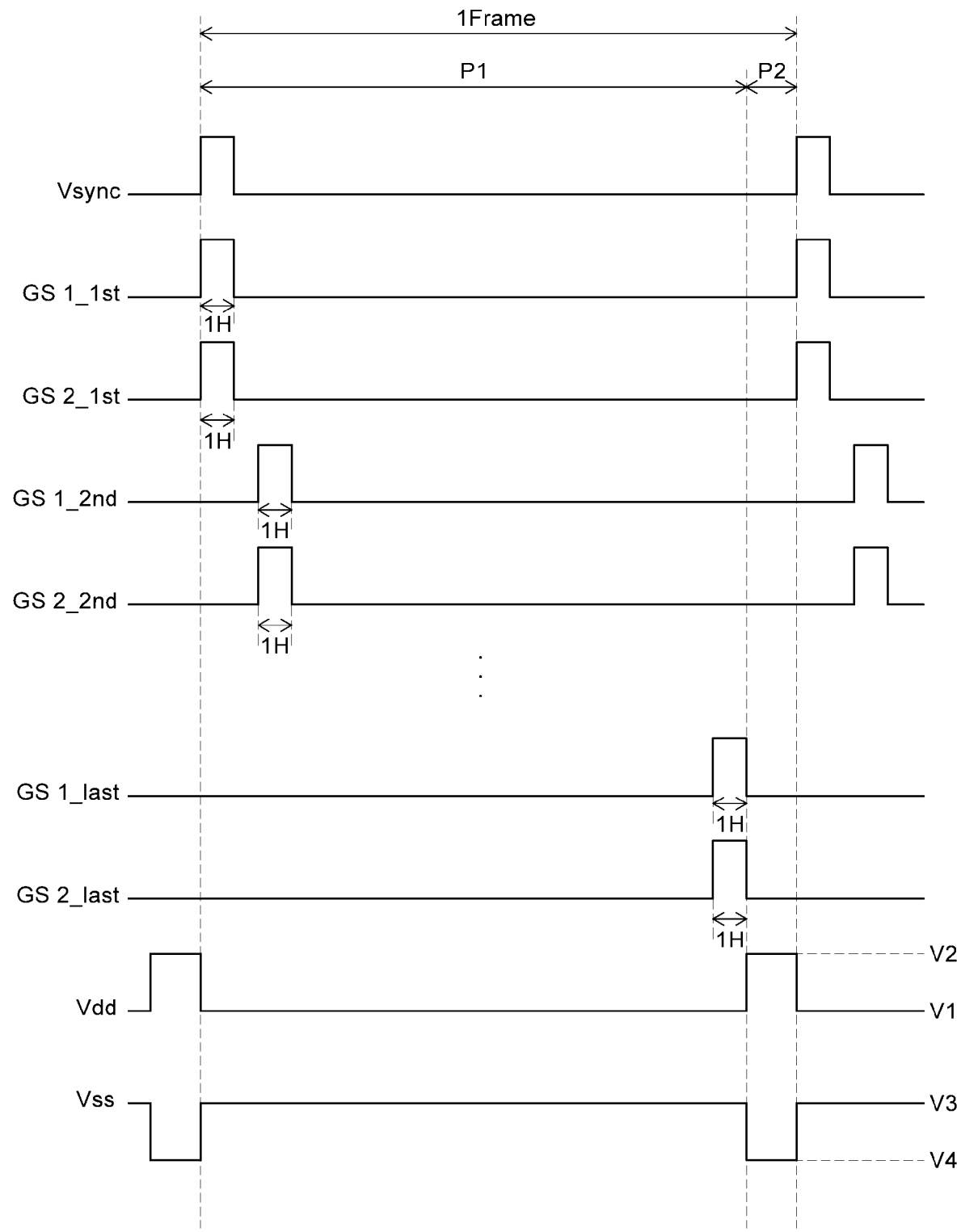

[Fig. 3B]
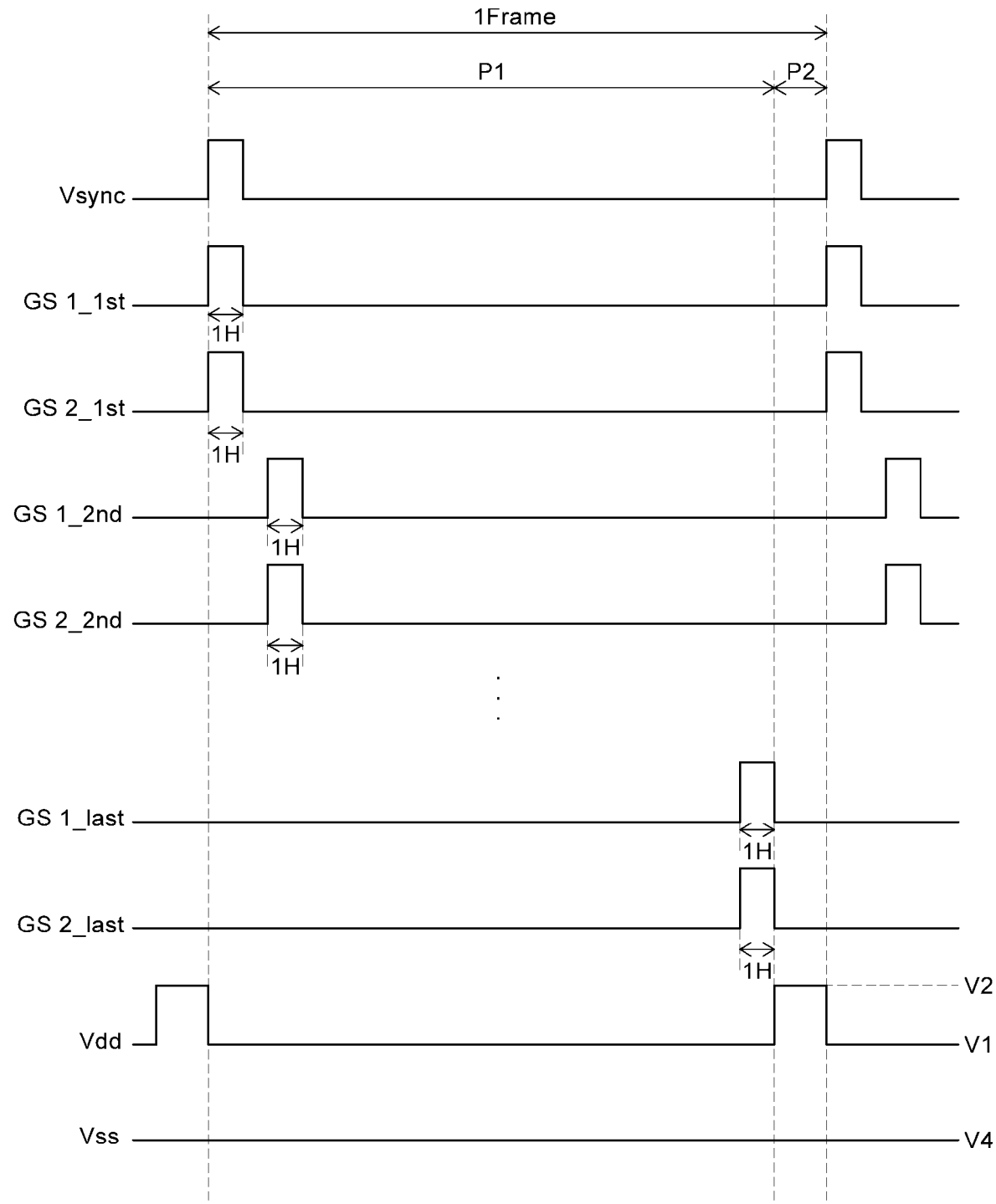

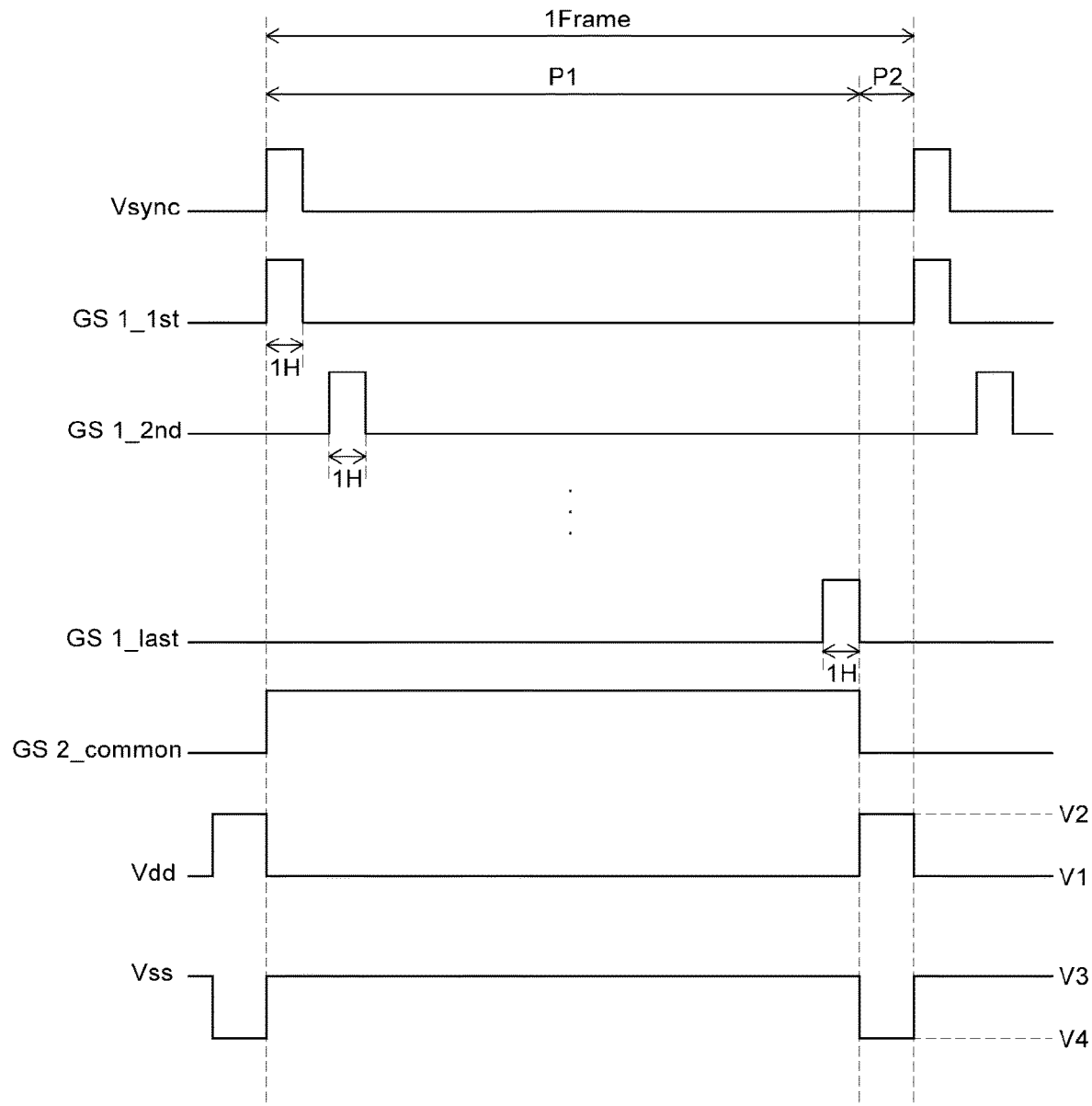

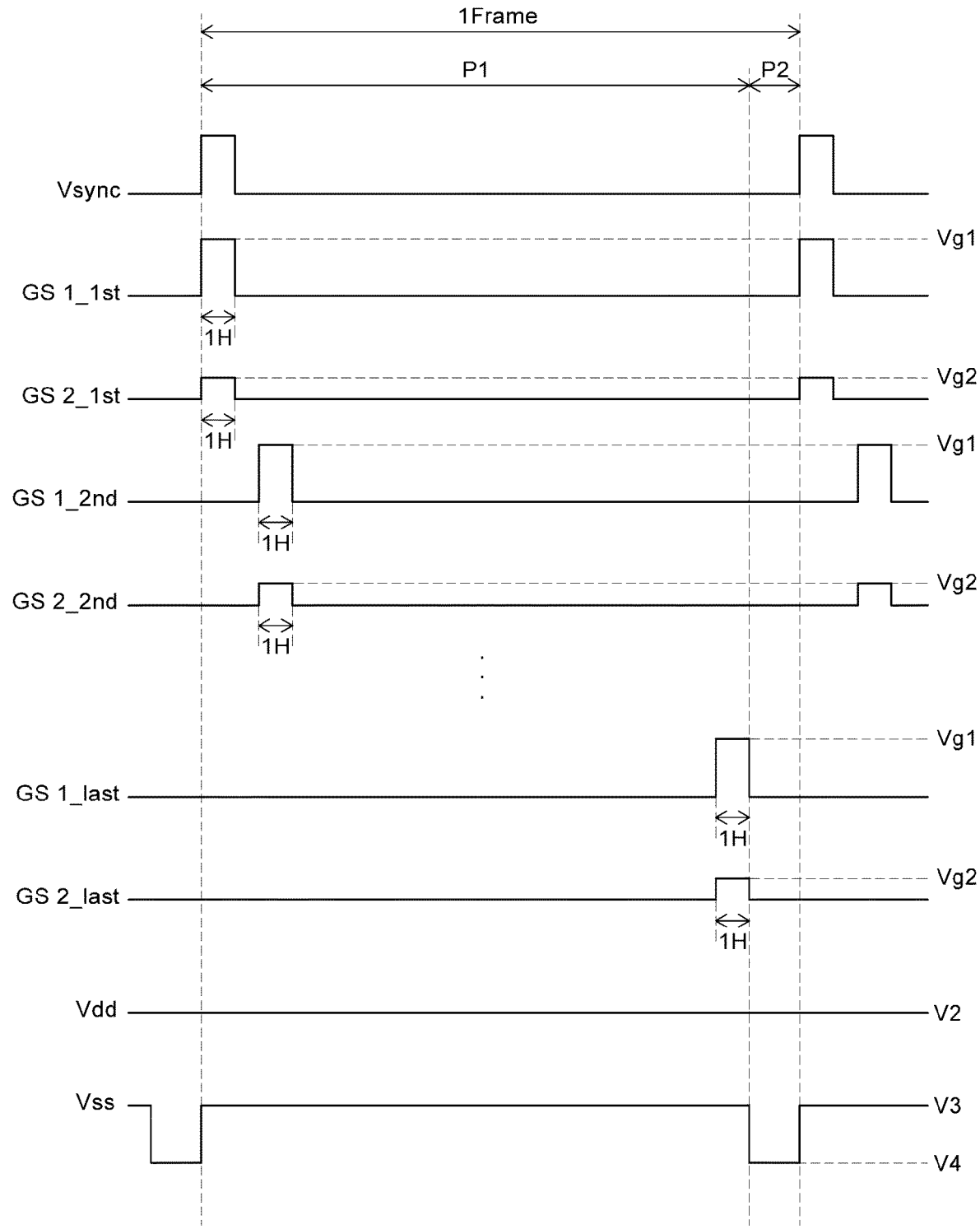
[Fig. 5]

[Fig. 6]
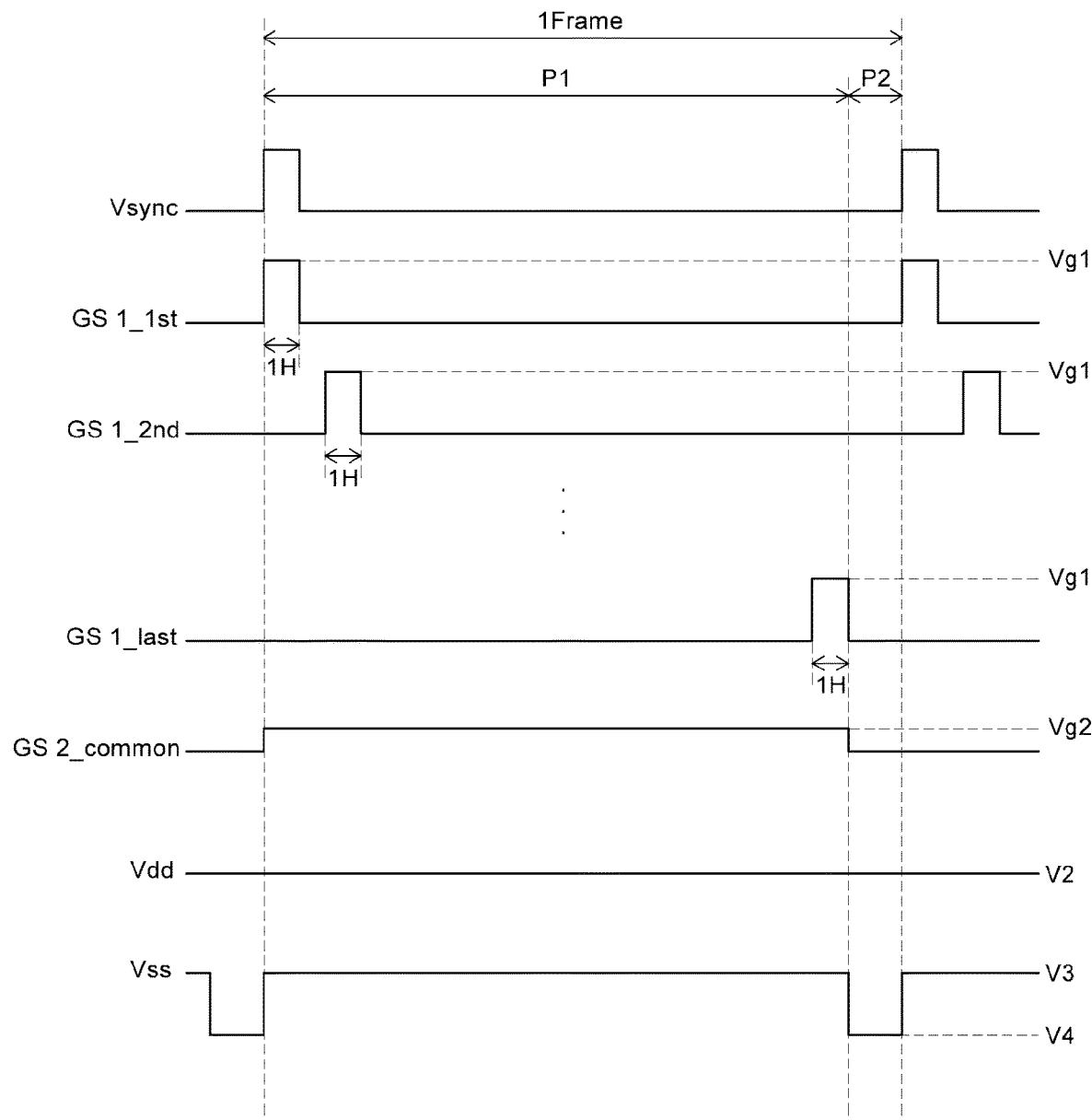

ORGANIC LIGHT EMITTING DISPLAY DEVICE

TECHNICAL FIELD

The present disclosure relates to an organic light emitting display device, and more particularly, to an organic light emitting display device which is capable of implementing virtual reality (VR).

DESCRIPTION OF THE RELATED ART

As the information society is developed, demands for display devices which display images are increased in various forms. Recently, a display device for implementing virtual reality is being studied to display a space which is similar to an actual space.

The virtual reality is an environment which allows people to virtually experience experience/environment, which cannot be actually obtained, by stimulating five senses (visual, auditory, olfactory, taste, and tactile senses) of human using an artificial technology. The virtual reality may be implemented through various hardware and software modules such as an input device, an output device, device driving software, or contents. Generally, a virtual reality implementing device may be configured by an input unit, a processing unit, and an output unit. Among them, the output unit may be configured by a display device with an increased immersion degree.

In the virtual reality device, a display device which expresses information is very important. Specifically, in order to implement immersion to the virtual reality, an image expression performance such as a resolution is important as well as a form of the image. Therefore, as one type of a display device for virtual reality, a head mount display (HMD) is frequently used. As for the HMD, a light and thin display device may be advantageously used.

Recently, an organic light emitting display device which will be applied to a display device serving as an output unit of a virtual reality device including the HMD has been studied. The organic light emitting display device is a display device using a self-emitting element using a thin light emitting layer between electrodes and is advantageously implemented as a light weight and thin thickness device. Therefore, studies for improving and changing a structure, an operation, or a function of an organic light emitting display device for a virtual reality device to be suitable for a usage characteristic of the virtual reality device have been deeply performed.

SUMMARY

The inventors of the present disclosure have studied to reduce the size of the pixel as much as possible in order to implement the virtual reality using the organic light emitting display device. Therefore, the inventors of the present disclosure configure a pixel circuit with a minimum configuration to reduce the size of the pixel, that is, configure each of a plurality of pixels by three transistors and one capacitor.

Further, the inventors of the present disclosure design adjacent pixels to share a vertical line, for example, a power line or a data line to reduce the size of the pixel. However, in the structure shared between pixels, a current difference between left and right pixels may be regularly generated due to a variation of a manufacturing process of a thin film transistor, which may be visually recognized as a smear.

Therefore, an object to be achieved by the present disclosure is to provide an organic light emitting display device which reduces the number of lines extending to a vertical direction on a display panel to implement an ultra-high definition.

Further, another object to be achieved by the present disclosure is to provide an organic light emitting display device in which each pixel is independently supplied with a voltage without sharing the power line or the data line with another pixel to constantly maintain a potential of a driving voltage.

Still another object to be achieved by the present disclosure is to provide an organic light emitting display device which simplifies a gate driver to reduce a size of a bezel.

Furthermore, still another object to be achieved by the present disclosure is to provide an organic light emitting display device which fixes a potential of the driving voltage to simplify a circuit of a power controller.

Technical objects of the present disclosure are not limited to the above-mentioned technical objects, and other technical objects, which are not mentioned above, can be clearly understood by those skilled in the art from the following descriptions.

According to an aspect of the present disclosure, an organic light emitting display device includes: a display panel on which a plurality of data lines, a plurality of gate lines, a plurality of first power lines, a plurality of second power lines, and a plurality of pixels are disposed, in which each of the plurality of pixels includes: a storage capacitor connected between a first node and a second node; a driving transistor including a gate electrode connected to the second node, a drain electrode connected to the first power line, and a source electrode connected to the first node; an organic light emitting diode connected to the first node and the second power line; a first switching transistor connected to the second node and the data line; and a second switching transistor connected to the first node and the first power line. Therefore, the number of power lines is reduced to implement an ultra-high definition.

According to another aspect of the present disclosure, an organic light emitting display device includes: a plurality of data lines; a plurality of power lines extending in the same direction as the plurality of data lines; a plurality of gate lines intersecting the plurality of data lines and the plurality of power lines; and a plurality of pixels applied with voltages from the plurality of data lines, the plurality of power lines, and the plurality of gate lines, in which each of the plurality of pixels includes: a driving transistor; a first switching transistor which applies a data voltage to a gate electrode of the driving transistor; a second switching transistor which applies a high potential driving voltage to a source electrode of the driving transistor; a storage capacitor which maintains a voltage applied to the gate electrode and the source electrode of the driving transistor; and an organic light emitting diode which is applied with a current flowing through the source electrode of the driving transistor to emit light, and the driving transistor and the second switching transistor share the power lines. Therefore, a smear of the display panel due to the noise of the driving voltage applied to the power line may be avoided.

Other detailed matters of the embodiments are included in the detailed description and the drawings.

According to the present disclosure, a size of each pixel of the organic light emitting display device can be reduced and an additional element design area of the pixel may also be ensured so as to implement an ultra-high definition by reducing the number of lines disposed on the display device.

Further, according to the present disclosure, the number of lines disposed on the display panel is reduced so that a failure rate during the process in accordance with simplification of the process may be reduced.

Further, according to the present disclosure, the adjacent pixels do not share the line so that the smear of the display panel due to a noise of a driving voltage which is applied to the power line may be avoided.

Further, according to the present disclosure, the number of shift registers of the gate driver may be reduced. Therefore, an area of the gate driver is reduced to reduce a non-display area of the display panel and also reduce the size of the bezel.

Furthermore, according to the present disclosure, a potential of a high potential driving voltage is fixed to remove some of components of a power controller for controlling the high potential driving voltage so that a circuit of the power controller can be simplified and noises of different driving voltages due to a potential change of the high potential driving voltage are avoided. Therefore, an image quality of the organic light emitting display device may be increased.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which:

FIG. 1 is a schematic block diagram for explaining an organic light emitting display device according to an exemplary embodiment of the present disclosure;

FIG. 2 is a circuit diagram illustrating a pixel of an organic light emitting display device according to an exemplary embodiment of the present disclosure;

FIG. 3A is a timing chart for explaining a driving of an organic light emitting display device according to an exemplary embodiment of the present disclosure;

FIG. 3B is a timing chart for explaining a driving of an organic light emitting display device according to another exemplary embodiment of the present disclosure; and FIGS. 4 to 6 are timing charts for explaining a driving of an organic light emitting display device according to various exemplary embodiments of the present disclosure.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals indicate like elements throughout the specification.

The features of various embodiments of the present disclosure can be partially or entirely bonded to or combined with each other and can be interlocked and operated in technically various ways which are understandable by those skilled in the art, and the embodiments can be carried out independently of or in association with each other.

Hereinafter, various exemplary embodiments of the present disclosure will be described in detail with reference to accompanying drawings.

FIG. 1 is a schematic block diagram of a display device according to an exemplary embodiment of the present disclosure. Referring to FIG. 1, an organic light emitting display device 100 according to an exemplary embodiment of the present disclosure includes a display panel 110, a data driver 120, a gate driver 130, a timing controller 140, and a power controller 150.

The display panel 110 includes a plurality of gate lines GL and a plurality of data lines DL which intersect each other in a matrix on the substrate using glass or plastic. A plurality of pixels Px is defined by the plurality of gate lines GL and the data lines DL.

The plurality of pixels Px of the display panel 110 is connected to the gate lines GL, the data lines DL, and the power lines PL. The plurality of pixels Px is applied with a driving voltage from the power lines PL to be driven based on a gate voltage transmitted from the gate lines GL and a data voltage transmitted from the data lines DL.

More specifically, the plurality of pixels applies a current to organic light emitting diodes OLED disposed on the plurality of pixels Px, based on the gate voltage and the data voltage. Electrons and holes discharged due to the current which is applied to the organic light emitting diodes OLED are coupled to generate excitons. The generated excitons emit light to implement a gray scale of the organic light emitting display device 100.

The plurality of pixels Px may implement light of a specific color. For example, the plurality of pixels Px may be configured by a red pixel which implements red, a green pixel which implements green, and a blue pixel which implements blue, but is not limited thereto.

The timing controller 140 supplies a data control signal DCS to the data driver 120 to control the data driver 120 and supplies a gate control signal GCS to the gate driver 130 to control the gate driver 130, and supplies a power control signal PCS to the power controller 150 to control the power controller 150.

The timing controller 140 starts scanning in accordance with a timing implemented by each frame, based on the timing signal TS received from an external host system. The timing controller 140 converts a video signal VS received from the external host system in accordance with a data signal format which is processible in the data driver 120 to output video data RGB. By doing this, the timing controller 140 controls data driving at an appropriate timing in accordance with the scanning.

The timing controller 140 receives various timing signals TS including a vertical synchronization signal Vsync, a vertical synchronization signal Hsync, a data enable signal DE, a data clock signal DCLK together with the video signal VS from the external host system.

In order to control the data driver 120, the gate driver 130, and the power controller 150, the timing controller 140 receives the timing signal TS such as the vertical synchronization signal Vsync, the horizontal synchronization signal Hsync, the data enable signal DE, and the data clock signal DCLK and generates various control signals DCS, GCS, and PCS. The timing controller 140 outputs the various control signals DCS, GCS, and PCS to the data driver 120, the gate driver 130, and the power controller 150.

For example, in order to control the gate driver 130, the timing controller 140 outputs various gate control signals GCS including a gate start pulse GSP, a gate shift clock GSC, and a gate output enable signal GOE.

Here, the gate start pulse controls an operation start timing of one or more gate circuits which configure the gate driver 130. The gate shift clock is a clock signal which is commonly input to one or more gate circuits and controls a shift timing of the scan signal (gate pulse). The gate output enable signal designates timing information of one or more gate circuits.

Further, in order to control the data driver 120, the timing controller 140 outputs various data control signals DCS including a source start pulse SSP, a source sampling clock SSC, and a source output enable signal SOE.

Here, the source start pulse controls a data sampling start timing of one or more data circuits which configure the data driver 120. The source sampling clock is a clock signal which controls a sampling timing of data in each data circuit. The source output enable signal controls an output timing of the data driver 120.

The timing controller 140 may be disposed on a control printed circuit board connected to a source printed circuit board to which the data driver 120 is bonded, through a connecting medium such as a flexible flat cable FFC or a flexible printed circuit FPC.

The gate driver 130 sequentially supplies a high potential (on-level) or a low potential (off-level) gate voltage to the gate lines GL in accordance with the control of the timing controller 140. Here, the gate lines GL may be divided into a first gate line GL1 through which a first gate voltage GS1 is applied and a second gate line GL2 through which the second gate voltage GS2 is applied.

According to a driving method, the gate driver 130 may be located only at one side of the display panel 110 or located at both sides if necessary.

The gate driver 130 may be connected to a bonding pad of the display panel 110 by a tape automated bonding (TAB) method or a chip on glass (COG) method. The gate driver 130 may also be implemented in a gate in panel (GIP) type to be directly disposed on the display panel 110 or may be disposed to be integrated with the display panel 110, if necessary.

The gate driver 130 may include a shift register or a level shifter.

The data driver 120 converts video data RGB received from the timing controller 140 into an analog data voltage Vdata and output the analog data voltage to the data lines DL.

The data driver 120 is connected to the bonding pad of the display panel 110 by a tape automated bonding method or a chip on glass method or may be directly disposed on the display panel 110. If necessary, the data driver 120 may be disposed to be integrated with the display panel 110.

Further, the data driver 120 may be implemented by a chip on film (COF) method. In this case, one end of the data driver 120 may be bonded to at least one source printed circuit board and the other end may be bonded to the display panel 110.

The data driver 120 may include a logic unit including various circuits such as a level shifter or a latch unit, a digital analog converter DAC, and an output buffer.

The power controller 150 may supply various voltages or currents to the display panel 110, the data driver 120, and the gate driver 130 or control various voltages or currents to be supplied. The power controller may also be referred to as a power management integrated circuit (PMIC).

The power controller 150 may apply a high potential driving voltage Vdd and a low potential driving voltage Vss to each of the plurality of pixels Px through the power lines PL.

Specifically, the power driver 150 may apply the high potential driving voltage Vdd to each of the plurality of pixels Px through the first power line PL1 and apply the low potential driving voltage Vss through the second power line PL2.

Here, the high potential driving voltage Vdd and the low potential driving voltage Vss may not be a fixed potential value, but may be a variable potential voltage.

The source printed circuit board and the control printed circuit board described above may be configured by one printed circuit board.

Additionally, the organic light emitting display device 100 according to the exemplary embodiment of the present disclosure may further include various additional elements for generating various signals or driving the pixels of the display panel. The additional elements for driving the pixels may include an inverter circuit, a multiplexer, or an electrostatic discharging circuit. The organic light emitting display device 100 may also include an additional element associated with a function other than a pixel driving function. For example, the organic light emitting display device 100 may include additional elements which provide a touch sensing function, a user authentication function (for example, fingerprint recognition), a multilevel pressure sensing function, or a tactile feedback function.

Hereinafter, a circuit structure of a pixel of an organic light emitting display device 100 according to an exemplary embodiment of the present disclosure will be described in detail with reference to FIG. 2.

FIG. 2 is a circuit diagram illustrating a pixel of an organic light emitting display device according to an exemplary embodiment of the present disclosure.

Referring to FIG. 2, each of the plurality of pixels Px includes an organic light emitting diode OLED which emits light, a driving transistor Td which drives the organic light emitting diode OLED, a first switching transistor Ts1 and a second switching transistor Ts2 which control the driving transistor Td, and a storage capacitor Cst which maintains a voltage between a gate electrode g and a source electrode s of the driving transistor Td for one frame.

The driving transistor Td controls the gray scale of the organic light emitting display device 100 in accordance with the data voltage Vdata by adjusting an amount of current flowing in the organic light emitting diode OLED.

Specifically, the gate electrode g of the driving transistor Td is connected to a second node N2, the drain electrode d of the driving transistor Td is connected to the first power line PL1, and the source electrode s of the driving transistor Td is connected to the first node N1. Here, a variable high potential driving voltage Vdd may be applied to the first power line PL1.

Although the source electrode s and the drain electrode d of the driving transistor Td are set on the basis of an n-type transistor, the electrodes of the driving transistor Td may also be set on the basis of a p-type transistor.

When the data voltage Vdata is applied to the second node N2 through the first switching transistor Ts1, a value of current Ids flowing between the drain electrode d and the source electrode s of the driving transistor Td is determined depending on a voltage Vgs between the gate electrode g and the source electrode s of the driving transistor Td.

The organic light emitting diode OLED is applied with the current Ids from the driving transistor Td to emit light to implement a gray scale corresponding to the current Ids value.

Specifically, the organic light emitting diode OLED includes a first electrode and a second electrode. Here, the first electrode may be an anode and the second electrode may be a cathode. An organic light emitting layer may be disposed between the first electrode and the second electrode. The first electrode of the organic light emitting diode OLED is connected to the first node N1 and the second electrode is connected to the second power line PL2. Here, a variable low potential driving voltage Vss may be applied to the second power line PL2.

The storage capacitor Cst is connected between the first node N1 and the second node N2 to maintain the voltage Vgs between the gate electrode g and the source electrode s of the driving transistor Td during a predetermined period.

The first switching transistor Ts1 is switched by a first gate voltage GS1 applied through the first gate line GL1. That is, the first switching transistor Ts1 is turned on by the first gate voltage GS1 to apply the data voltage Vdata to the second node N2.

Specifically, the gate electrode g of the first switching transistor Ts1 is connected to the first gate line GL1, the drain electrode d of the first switching transistor Ts1 is connected to the data line DL, and the source electrode s of the first switching transistor Ts1 is connected to the second node N2.

The second switching transistor Ts2 is switched by a second gate voltage GS2 applied through the second gate line GL2. That is, the second switching transistor Ts2 is turned on by the second gate voltage GS2 to apply the high potential driving voltage Vdd to the first node N1.

Specifically, the gate electrode g of the second switching transistor Ts2 is connected to the second gate line GL2, the drain electrode d of the second switching transistor Ts2 is connected to the first power line PL1, and the source electrode s of the second switching transistor Ts2 is connected to the first node N1.

FIG. 3A is a timing chart for explaining a driving of an organic light emitting display device according to an exemplary embodiment of the present disclosure.

Referring to FIG. 3A, one frame is divided into a first period P1 and a second period P2. The first period P1 is a data write and hold period when the data voltage Vdata is written in each pixel Px and is maintained for a predetermined time and the second period P2 includes an emission period when light is emitted in accordance with the written data. That is, during the second period P2, the organic light emitting diode OLED may emit light.

As illustrated in FIG. 3A, during the first period P1, the first gate voltage GS1 and the second gate voltage GS2 which are high potentials are sequentially applied to the first gate line GL1 and the second gate line GL2 which are connected to the plurality of pixels Px of each row disposed on the display panel 110 only during one horizontal period (1H). Therefore, the first switching transistor Ts1 and the second switching transistor Ts2 disposed in the plurality of pixels Px of each row are turned on only during one horizontal period (1H).

Specifically, the first gate voltage $GS1\_1_{st}$ and the second gate voltage $GS2\_1_{st}$ which are high potentials are applied to a first first gate line GL1 and a first second gate line GL2 during one horizontal period (1H) in accordance with a rising timing of the vertical synchronization signal Vsync. Therefore, the first switching transistor Ts1 and the second switching transistor Ts2 disposed in the plurality of pixels Px of the first row are turned on. Thereafter, a first gate voltage $GS1\_1_{st}$ and a second gate voltage GS2_1st which are low potentials are applied to a first first gate line GL1 and a first second gate line GL2 during one horizontal period (1H) so that the first switching transistor Ts1 and the second switching transistor Ts2 disposed in the plurality of pixels Px of the first row are turned off. Simultaneously, a first gate voltage GS1_2nd and a second gate voltage GS2_2nd which are high potentials are applied to a second first gate line GL1 and a second second gate line GL2 during one horizontal period (1H) so that the first switching transistor Ts1 and the second switching transistor Ts2 disposed in a plurality of pixels Px of a second row are turned on. By repeating this operation, finally, a first gate voltage GS1 last and a second gate voltage GS2 last which are high potentials are applied to a last first gate line GL1 and a last second gate line GL2 during one horizontal period (1H) so that the first switching transistor Ts1 and the second switching transistor Ts2 disposed in a plurality of pixels Px of a last row are turned on.

Here, the high potential first gate voltage GS1 and the high potential second gate voltage GS2 may be the same potential. For example, high potential voltages of the high potential first gate voltage GS1 and the high potential second gate voltage GS2 may be set to be 8 V or higher. The first gate voltage GS1 and the second gate voltage GS2 are set as described above to turn on the first switching transistor Ts1 and the second switching transistor Ts2.

During the first period P1, a high potential driving voltage Vdd which is applied to the first power line PL1 may be set to be a first potential V1 and a low potential driving voltage Vss which is applied to the second power line PL2 may be set to be a third potential V3. Here, the third potential V3 may have a value between the first potential V1 and a fourth potential V4 which will be described below. For example, the first potential V1 may be 1 V, the third potential V3 may be 0 V to 1 V, and the fourth potential V4 may be 0 V. The relationship of the third potential V3 is set as described above so that the organic light emitting diode OLED may be suppressed from emitting light during the first period P1 which is a data write and hold period.

As described above, during the first period P1, the first gate voltage GS1, the second gate voltage GS2, the high potential driving voltage Vdd, and the low potential driving voltage Vss are applied. By doing this, the second node N2 connected to the source electrode s of the first switching transistor Ts1 is applied with the data voltage Vdata and the first node N1 connected to the source electrode s of the second switching transistor Ts2 is applied with a high potential driving voltage Vdd which is the first potential V1.

Accordingly, since the source electrode s and the drain electrode d of the driving transistor Td are applied with the same voltage which is the high potential driving voltage Vdd of the first potential V1, the current Ids does not flow in the source electrode s and the drain electrode d of the driving transistor Td. Therefore, the organic light emitting diode OLED does not emit light.

However, a potential difference Vgs of the gate electrode g and the source electrode s of the driving transistor Td which is a potential difference of the second node N2 and the first node N1 is maintained so that the data is written in the driving transistor Td of each pixel Px.

Next, the organic light emitting diode OLED emits light by the data written in each pixel during the second period P2.

During the second period P2, the low potential first gate voltage GS1 and the low potential second gate voltage GS2 are applied to both the first gate line GL1 and the second gate line GL2. Accordingly, the first switching transistor Ts1 and the second switching transistor Ts2 are maintained to be turned off.

However, during the second period P2, the high potential driving voltage Vdd which is applied to the first power line PL1 may be set to be a second potential V2 and a low potential driving voltage Vss which is applied to the second power line PL2 may be set to be a fourth potential V4. Here, the second potential V2 is higher than the first potential V1 and the fourth potential V4 is lower than the third potential V3. A potential difference between the second potential V2 and the fourth potential V4 may be 8.5 V to 10 V. For example, the second potential V2 may be 8.5 V to 10 V and the fourth potential V4 may be 0 V.

As described above, a voltage applied to the drain electrode d of the driving transistor Td rises by setting the high potential driving voltage Vdd to be 8.5 V to 10 V to flow the current Ids between the drain electrode d and the source electrode s of the driving transistor Td. Since the amount of flowing current Ids is determined based on the voltage Vgs of the gate electrode g and the source electrode s of the driving transistor Td, the amount of flowing current Ids is determined based on the data voltage Vdata. Therefore, the organic light emitting diode OLED applied with the driving current Ids emits light to express a gray scale corresponding to the data voltage Vdata.

As described above, both the first switching transistor Ts1 and the driving transistor Td of the organic light emitting display device 100 according to the exemplary embodiment of the present disclosure are connected to the first power line PL1 and raise the high potential driving voltage Vdd which is applied to the first power line PL1 from the first potential V1 to the second potential V2 during the second period P2 which is an emission period.

Therefore, the driving transistor Td may be applied with the high potential driving voltage Vdd having a second potential V2 which is the high potential driving voltage Vdd of the related art through the first power line PL1 during the second period P2. The second switching transistor Ts2 may be applied with the high potential driving voltage Vdd having a first potential V1 which is the reference voltage of the related art through the first power line PL1 during the first period P1. By doing this, the pixel Px of the organic light emitting display device according to the exemplary embodiment of the present disclosure may combine the reference voltage line and the high potential driving voltage line of the related art to the first power line PL1.

Therefore, the organic light emitting display device according to the exemplary embodiment of the present disclosure may not only reduce the size of each pixel Px of the organic light emitting display device but also ensure an additional element design area of the pixel Px, so as to implement an ultra-high definition. Further, the number of lines disposed on the display panel 110 is reduced so that a failure rate during the process in accordance with simplification of the process may be reduced.

FIG. 3B is a timing chart for explaining a driving of an organic light emitting display device according to another exemplary embodiment of the present disclosure.

Hereinafter, the driving of an organic light emitting display device according to another exemplary embodiment of the present disclosure will be described with reference to FIG. 3B. Since a circuit structure of a pixel disposed in the organic light emitting display device according to another exemplary embodiment of the present disclosure is the same as the pixel circuit structure of the organic light emitting display device according to the exemplary embodiment of the present disclosure, a description of the circuit structure of the pixel will be omitted. Further, only the difference between the driving of the organic light emitting display device according to another exemplary embodiment of the present disclosure and the driving of the organic light emitting display device according to the exemplary embodiment of the present disclosure is a method of applying a low potential driving voltage. Therefore, the method of applying a low potential driving voltage will be mainly described.

During the first period P1, a high potential driving voltage Vdd which is applied to the first power line PL1 may be set to be a first potential V1 and a low potential driving voltage Vss which is applied to the second power line PL2 may be set to be a fourth potential V4.

Further, during the second period P2, the high potential driving voltage Vdd which is applied to the first power line PL1 may be set to be a second potential V2 and a low potential driving voltage Vss which is applied to the second power line PL2 may be set to be a fourth potential V4. That is, the low potential driving voltage Vss during the first period P1 and the second period P2 is maintained to be the fourth potential V4.

For example, the first potential V1 may be 1 V, the second potential V2 may be 8.5 V to 10 V, and the fourth potential V4 may be 0 V.

As described above, since the potential of the low potential driving potential Vss is constantly maintained, noises of different driving voltages due to the potential change of the high potential driving voltage Vdd are avoided so that an image quality of the organic light emitting display device 100 may be improved.

FIGS. 4 to 6 are timing charts for explaining a driving of an organic light emitting display device according to various exemplary embodiments of the present disclosure.

Hereinafter, the driving of an organic light emitting display device according to still another exemplary embodiment of the present disclosure will be described with reference to FIG. 4. Since a circuit structure of a pixel disposed in the organic light emitting display device according to another exemplary embodiment of the present disclosure is the same as the pixel circuit structure of the organic light emitting display device according to the exemplary embodiment of the present disclosure, a description of the circuit structure of the pixel will be omitted. Further, only the difference between the driving of the organic light emitting display device according to another exemplary embodiment of the present disclosure and the driving of the organic light emitting display device according to the exemplary embodiment of the present disclosure is a method of applying a second gate voltage. Therefore, the method of applying a second gate voltage will be mainly described.

As illustrated in FIG. 4, during the first period P1, the first gate voltage GS1 which is a high potential is sequentially applied to the first gate lines GL1 which are connected to the plurality of pixels Px of each row disposed on the display panel 110 only during one horizontal period (1H) and the high potential second gate voltage GS2 is applied during the first period P1. Therefore, the first switching transistor Ts1 disposed in the plurality of pixels Px of each row is turned on only during one horizontal period (1H) but the second switching transistor Ts2 disposed in the plurality of pixels Px of each row is continuously turned on during the first period P1.

Specifically, the first gate voltage GS1_1st which is a high potential is applied to the first first gate line GL1 during one horizontal period (1H) in accordance with a rising timing of the vertical synchronization signal Vsync to turn on the first switching transistor Ts1 disposed in the plurality of pixels Px of the first row. Thereafter, the first gate voltage GS1_1st which is a low potential is applied to the first first gate line GL1 to turn off the first switching transistor Ts1 disposed in the plurality of pixels Px of the first row. Simultaneously, a first gate voltage GS_2nd which is a high potential is applied to the second first gate line GL1 during one horizontal period (1H) to turn on the first switching transistor Ts1 disposed in the plurality of pixels Px of the second row. By repeating the above operation, a first gate voltage GS1 last which is a high potential is applied to the last first gate line GL1 during one horizontal period (1H) to turn on the first switching transistor Ts1 disposed in the plurality of pixels Px of the last row.

In contrast, during the first period P1, a second gate voltage of a high potential (GS2 common) is applied to the second gate lines GL2 of all rows so that the first switching transistor Ts1 is continuously turned on.

Here, the high potential first gate voltage GS1 and the high potential second gate voltage GS2 may be the same potential. For example, high potential voltages of the high potential first gate voltage GS1 and the high potential second gate voltage GS2 may be set to be 8 V or higher. The first gate voltage GS1 and the second gate voltage GS2 are set as described above to turn on the first switching transistor Ts1 and the second switching transistor Ts2.

As described above, during the first period P1, the first gate voltage GS1, the second gate voltage GS2, the high potential driving voltage Vdd, and the low potential driving voltage Vss are applied. By doing this, the second node N2 connected to the source electrode s of the first switching transistor Ts1 is applied with the data voltage Vdata and the first node N1 connected to the source electrode s of the second switching transistor Ts2 is applied with a high potential driving voltage Vdd which is the first potential V1.

Accordingly, since the source electrode s and the drain electrode d of the driving transistor Td are applied with the same voltage which is the high potential driving voltage Vdd of the first potential V1, the current Ids does not flow in the source electrode s and the drain electrode d of the driving transistor Td. Therefore, the organic light emitting diode OLED does not emit light.

However, a potential difference Vgs of the gate electrode g and the source electrode s of the driving transistor Td which is the potential difference of the second node N2 and the first node N1 is maintained so that the data is written in the driving transistor Td of each pixel Px.

Next, the organic light emitting diode OLED emits light by the data written in each pixel during the second period P2.

During the second period P2, the low potential first gate voltage GS1 and the low potential second gate voltage GS2 are applied to both the first gate line GL1 and the second gate line GL2. Accordingly, the first switching transistor Ts1 and the second switching transistor Ts2 are maintained to be turned off.

Further, a voltage applied to the drain electrode d of the driving transistor Td rises to flow the current Ids between the drain electrode d and the source electrode s of the driving transistor Td. Since the amount of flowing current Ids is determined based on the voltage Vgs of the gate electrode g and the source electrode s of the driving transistor Td, the amount of flowing current Ids is determined based on the data voltage Vdata. Therefore, the organic light emitting diode OLED applied with the driving current Ids emits light to express a gray scale corresponding to the data voltage Vdata.

As described above, in the organic light emitting display device according to another exemplary embodiment of the present disclosure, the first gate voltage GS1 is sequentially shifted by one horizontal period (1H) during the first period P1, but the second gate voltage GS2 is continuously maintained to be a high potential during the first period.

Therefore, there is no need to sequentially shift the second gate voltage GS2 by one horizontal period (1H) similarly to the first gate voltage GS1, so that the number of shift registers of the gate driver 130 may be reduced. Accordingly, the area of the gate driver 130 is reduced so that the area of the control printed circuit board is reduced and the non-display area of the display panel 110 is reduced so that a bezel size is also reduced.

Further, similarly to the other exemplary embodiment, also in another exemplary embodiment of the present disclosure, during the first period P1, a high potential driving voltage Vdd which is applied to the first power line PL1 may be set to be a first potential V1 and a low potential driving voltage Vss which is applied to the second power line PL2 may be set to be a fourth potential V4. Further, during the second period P2, the high potential driving voltage Vdd which is applied to the first power line PL1 may be set to be a second potential V2 and a low potential driving voltage Vss which is applied to the second power line PL2 may be set to be a fourth potential V4. That is, the low potential driving voltage Vss during the first period P1 and the second period P2 is maintained to be the fourth potential V4.

For example, the first potential V1 may be 1 V, the second potential V2 may be 8.5 V to 10 V, and the fourth potential V4 may be 0 V.

As described above, since the potential of the low potential driving voltage Vss is constantly maintained, noises of different driving voltages due to the potential change of the high potential driving voltage Vdd are avoided so that an image quality of the organic light emitting display device 100 may be improved.

Hereinafter, the driving of an organic light emitting display device according to still another exemplary embodiment of the present disclosure will be described with reference to FIGS. 5 and 6. Since a circuit structure of a pixel disposed in the organic light emitting display device according to another exemplary embodiment of the present disclosure is the same as the pixel circuit structure of the organic light emitting display device according to the exemplary embodiment of the present disclosure, a description of the circuit structure of the pixel will be omitted. Further, only the difference between the driving of the organic light emitting display device according to another exemplary embodiment of the present disclosure and the driving of the organic light emitting display device according to the exemplary embodiment of the present disclosure is a high potential second gate voltage. Therefore, the high potential second gate voltage will be mainly described.

Referring to FIGS. 5 and 6, in the organic light emitting display device according to another exemplary embodiment of the present disclosure, a high potential second gate voltage Vg2 is lower than a high potential first gate voltage Vg1. Specifically, the high potential second gate voltage Vg2 may be a sum of the high potential driving voltage Vdd having a first potential V1 and a threshold voltage Vth of the second switching transistor Ts2. For example, when the threshold voltage Vth of the second switching transistor Ts2 is 1 V and the high potential driving voltage Vdd having the first potential V1 is also 1 V, the high potential second gate voltage Vg2 may be 2 V.

Further, a high potential driving voltage Vdd which is applied to the first power line PL1 during the first period P1 may be set to be a second potential V2 and a low potential driving voltage Vss which is applied to the second power line PL2 may be set to be a third potential V3.

As described above, during the first period P1, the high potential first gate voltage Vg1, the high potential second gate voltage Vg2, the high potential driving voltage Vdd, and the low potential driving voltage Vss are applied. By doing this, the second node N2 connected to the source electrode s of the first switching transistor Ts1 is applied with the data voltage Vdata and the first node N1 connected to the source electrode s of the second switching transistor Ts2 is applied with a driving voltage Vdd having a first potential V1 which is a difference between the high potential second gate voltage Vg2 and the threshold voltage Vth of the second switching transistor Ts2. That is, the first node N1 is applied with 1 V which is a driving voltage Vdd having a first potential V1 corresponding to the difference between 2 V of the high potential second gate voltage Vg2 and 1 V of the threshold voltage Vth of the second switching transistor Ts2.

Further, during the second period P2, the low potential first gate voltage GS1 and the low potential second gate voltage GS2 are applied to both the first gate line GL1 and the second gate line GL2. Accordingly, the first switching transistor Ts1 and the second switching transistor Ts2 are maintained to be turned off.

Further, during the second period P2, the high potential driving voltage Vdd which is applied to the first power line PL1 may be maintained to be a second potential V2 similarly to the first period P1 and a low potential driving voltage Vss which is applied to the second power line PL2 may be set to be a fourth potential V4.

As described above, the low potential driving voltage Vss having the fourth potential V4 is set to flow the current Ids between the drain electrode d and the source electrode s of the driving transistor Td. Since the amount of flowing current Ids is determined based on the voltage Vgs of the gate electrode g and the source electrode s of the driving transistor Td, the amount of flowing current Ids is determined based on the data voltage Vdata. Therefore, the organic light emitting diode OLED applied with the driving current Ids emits light to express a gray scale corresponding to the data voltage Vdata.

As described above, in another organic light emitting display device of the present disclosure, the high potential second gate voltage Vg2 may be set to be a sum of the high potential driving voltage Vdd having a first potential V1 and a threshold voltage Vth of the second switching transistor Ts2. That is, the high potential second gate voltage Vg2 may be set to be lower than a sum of the high potential driving voltage Vdd having a second potential V2 which is applied during the first period and a threshold voltage Vth of the second switching transistor Ts2. The high potential second gate voltage Vg2 is set as described above so that during the first period P1 and the second period P2, the high potential driving voltage Vdd applied to the first power line PL1 may be continuously fixed to be a second potential V2.

Therefore, the organic light emitting display device 100 may be driven only by controlling the low potential driving voltage Vss while constantly maintaining the potential of the high potential driving voltage Vdd.

Accordingly, the potential of the high potential driving voltage Vdd is constantly maintained so that some components of the power controller 150 for controlling the high potential driving voltage Vdd may be removed, to achieve circuit simplification of the power controller 150.

Further, since the potential of the high potential driving voltage Vdd is constantly maintained, noises of different driving voltages due to the potential change of the high potential driving voltage Vdd are avoided so that an image quality of the organic light emitting display device 100 may be improved.

The exemplary embodiments of the present disclosure can also be described as follows:

According to an aspect of the present disclosure, an organic light emitting display device includes: a display panel on which a plurality of data lines, a plurality of gate lines, a plurality of first power lines, a plurality of second power lines, and a plurality of pixels are disposed, in which each of the plurality of pixels includes: a storage capacitor connected between a first node and a second node; a driving transistor including a gate electrode connected to the second node, a drain electrode connected to the first power line, and a source electrode connected to the first node; an organic light emitting diode connected to the first node and the second power line; a first switching transistor connected to the second node and the data line; and a second switching transistor connected to the first node and the first power line.

According to another aspect of the present disclosure, the organic light emitting display device may be driven by separating a first period when a data voltage is applied to the gate electrode of the driving transistor and a second period when the organic light emitting diode emits light based on the data voltage.

According to still another aspect of the present disclosure, a high potential driving voltage having a first potential is applied to the plurality of first power lines during the first period, a high potential driving voltage having a second potential is applied to the plurality of first power lines during the second period, and the second potential is higher than the first potential.

According to still another aspect of the present disclosure, a low potential driving voltage having a third potential is applied to the plurality of second power lines during the first period, a low potential driving voltage having a fourth potential is applied to the plurality of second power lines during the second period, and the third potential is higher than the fourth potential.

According to still another aspect of the present disclosure, during the first period and the second period, a low potential driving voltage having a third potential is applied to the plurality of second power lines.

According to still another aspect of the present disclosure, a high potential driving voltage having a first potential is applied to the plurality of first power lines during the first period and the second period, a low potential driving voltage having a third potential is applied to the plurality of second power lines during the first period, a low potential driving voltage having a fourth potential is applied to the plurality of second power lines during the second period, and the third potential is higher than the fourth potential.

According to still another aspect of the present disclosure, the third potential is lower than the first potential.

According to still another aspect of the present disclosure, the plurality of gate lines includes a plurality of first gate lines and a plurality of second gate lines, the first switching transistor is switched through a first gate voltage applied through the plurality of first gate lines, and the second switching transistor is switched through a second gate voltage applied through the plurality of second gate lines.

According to still another aspect of the present disclosure, the first gate voltage and the second gate voltage are high potentials only during one horizontal period of the first period.

According to still another aspect of the present disclosure, the first gate voltage is a high potential only during one horizontal period of the first period and the second gate voltage is a high potential during the entire first period.

According to still another aspect of the present disclosure, the high potential of the second gate voltage is lower than the high potential of the first gate voltage.

According to still another aspect of the present disclosure, the high potential of the second gate voltage is lower than a sum of the high potential driving voltage applied during the first period and a threshold voltage of the second switching transistor.

According to another aspect of the present disclosure, an organic light emitting display device includes: a plurality of data lines; a plurality of power lines extending in the same direction as the plurality of data lines; a plurality of gate lines intersecting the plurality of data lines and the plurality of power lines; and a plurality of pixels applied with voltages from the plurality of data lines, the plurality of power lines, and the plurality of gate lines, in which each of the plurality of pixels includes: a driving transistor; a first switching transistor which applies a data voltage to a gate electrode of the driving transistor; a second switching transistor which applies a high potential driving voltage to a source electrode of the driving transistor; a storage capacitor which maintains a voltage applied to the gate electrode and the source electrode of the driving transistor; and an organic light emitting diode which is applied with a current flowing through the source electrode of the driving transistor to emit light, and the driving transistor and the second switching transistor share the power lines.

According to another aspect of the present disclosure, a potential of a voltage applied to the power lines rises during a period when the organic light emitting diode emits light.

According to still another aspect of the present disclosure, the plurality of gate lines includes a plurality of first gate lines connected to the first switching transistors and a plurality of second gate lines connected to the second switching transistors and a high potential of the second gate voltage which is applied to the plurality of second gate lines is lower than a high potential of the first gate voltage which is applied to the first gate lines.

Although the exemplary embodiments of the present disclosure have been described in detail with reference to the accompanying drawings, the present disclosure is not limited thereto and may be embodied in many different forms without departing from the technical concept of the present disclosure. Accordingly, the exemplary embodiments disclosed herein are not intended to limit but describe the technical spirit of the present disclosure and the scope of the technical spirit of the present disclosure is not restricted by the exemplary embodiments. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. An organic light emitting display device, comprising:
   a display panel on which a plurality of data lines, a plurality of gate lines, a plurality of first power lines, a plurality of second power lines, and a plurality of pixels are disposed,
   wherein each of the plurality of pixels includes:
   a storage capacitor connected between a first node and a second node;
   a driving transistor including a gate electrode connected to the second node, a drain electrode connected to one of the plurality of first power lines, and a source electrode connected to the first node;
   an organic light emitting diode connected to the first node and one of the plurality of second power lines;
   a first switching transistor connected to the second node and one of the plurality of data lines; and
   a second switching transistor connected to the first node and the one of the plurality of first power lines,
   wherein the plurality of gate lines includes a plurality of first gate lines and a plurality of second gate lines,
   the first switching transistor is switched through a first gate voltage applied through one of the plurality of first gate lines, and
   the second switching transistor is switched through a second gate voltage applied through one of the plurality of second gate lines,
   wherein a high potential of the second gate voltage is less than a high potential of the first gate voltage.

2. The organic light emitting display device according to claim 1, wherein the organic light emitting display device is driven by separating a first period when a data voltage is applied to the gate electrode of the driving transistor and a second period when the organic light emitting diode emits light based on the data voltage.

3. The organic light emitting display device according to claim 2, wherein a high potential driving voltage having a first potential is applied to the plurality of first power lines during the first period,
   a high potential driving voltage having a second potential is applied to the plurality of first power lines during the second period, wherein the second potential is higher than the first potential.

4. The organic light emitting display device according to claim 3, wherein a low potential driving voltage having a third potential is applied to the plurality of second power lines during the first period,
   a low potential driving voltage having a fourth potential is applied to the plurality of second power lines during the second period, wherein the third potential is higher than the fourth potential.

5. The organic light emitting display device according to claim 4, wherein the third potential is lower than the first potential.

6. The organic light emitting display device according to claim 3, wherein during the first period and the second period, a low potential driving voltage having a third potential is applied to the plurality of second power lines.

7. The organic light emitting display device according to claim 3, wherein a low potential driving voltage having a fourth potential is applied to the plurality of second power lines during each of the first period and the second period.

8. The organic light emitting display device according to claim 2, wherein a high potential driving voltage having a first potential is applied to the plurality of first power lines during the first period and the second period,
a low potential driving voltage having a third potential is applied to the plurality of second power lines during the first period,
a low potential driving voltage having a fourth potential is applied to the plurality of second power lines during the second period, wherein the third potential is higher than the fourth potential.

9. The organic light emitting display device according to claim 2, wherein the first gate voltage and the second gate voltage are high potentials only during one horizontal period of the first period.

10. The organic light emitting display device according to claim 2, wherein the first gate voltage is a high potential only during one horizontal period of the first period and the second gate voltage is a high potential during the first period in its entirety.

11. The organic light emitting display device according to claim 10, wherein the high potential of the second gate voltage is lower than a sum of the high potential driving voltage applied during the first period and a threshold voltage of the second switching transistor.

12. The organic light emitting display device according to claim 1, wherein the high potential of the second gate voltage is a sum of the high potential driving voltage applied during the first period and a threshold voltage of the second switching transistor.

13. The organic light emitting display device according to claim 2, wherein a high potential driving voltage having a second potential is applied to the plurality of first power lines during each of the first period and the second period.

14. An organic light emitting display device, comprising:
a plurality of data lines;
a plurality of power lines extending in a same direction as the plurality of data lines;
a plurality of gate lines intersecting the plurality of data lines and the plurality of power lines; and
a plurality of pixels applied with voltages from the plurality of data lines, the plurality of power lines, and the plurality of gate lines,
wherein each of the plurality of pixels includes:
a driving transistor;
a first switching transistor which applies a data voltage to a gate electrode of the driving transistor;
a second switching transistor which applies a high potential driving voltage to a source electrode of the driving transistor;
a storage capacitor which maintains a voltage applied to the gate electrode and the source electrode of the driving transistor; and
an organic light emitting diode which is applied with a current flowing through the source electrode of the driving transistor to emit light,
wherein the driving transistor and the second switching transistor are connected to a same power line from the plurality of power lines,
wherein the plurality of gate lines includes a plurality of first gate lines connected to the first switching transistors and a plurality of second gate lines connected to the second switching transistors and a high potential of a second gate voltage which is applied to the plurality of second gate lines is less than a high potential of a first gate voltage which is applied to the plurality of first gate lines.

15. The organic light emitting display device according to claim 14, wherein a potential of a voltage applied to the same power line rises during a period when the organic light emitting diode emits light.

* * * * *